United States Patent [19]

Pilot et al.

[11] Patent Number: 4,795,899

[45] Date of Patent: Jan. 3, 1989

[54] ILLUMINATION SENSOR WITH ATTENUATING DIFFUSER

[75] Inventors: Alain Pilot, Bretonneux; Marcel Grasset, Bois D'Arcy, both of France

[73] Assignee: Societe Francaise d'Equipements pour la Navigation Aerienne (S.F.E.N.A.), France

[21] Appl. No.: 30,314

[22] Filed: Mar. 26, 1987

[30] Foreign Application Priority Data

Mar. 28, 1986 [FR] France ................................ 86 04526

[51] Int. Cl.⁴ ................................................ H01J 3/14

[52] U.S. Cl. ..................................... 250/216; 250/239

[58] Field of Search ................... 250/216, 237 R, 239, 250/227; 356/236, 225, 221, 215

[56] References Cited

U.S. PATENT DOCUMENTS

| | | | |
|---|---|---|---|
| 3,709,615 | 1/1973 | Blakeslee et al. | 356/225 |
| 4,178,101 | 12/1979 | Booth | 250/227 |
| 4,181,398 | 1/1980 | Sick | 356/225 |
| 4,703,173 | 10/1987 | Wood et al. | 250/227 |

*Primary Examiner*—David C. Nelms

*Attorney, Agent, or Firm*—William A. Drucker

[57] ABSTRACT

A lighting sensor is provided including a sleeve made from a translucent material having a bottom intended to be exposed to the light whose illumination it is desired to measure, an optoelectronic component positioned inside the sleeve with its sensitive face disposed in line with said bottom and means for securing said component and said sleeve together.

The invention overcomes in a simple way the problems due to the non linearity of the signal delivered by the optoelectronic component to the saturation of this component and to the narrowness of its aperture angle.

13 Claims, 3 Drawing Sheets

10
11
21
15
240°
17
14
12
13
20
18
16
24
e
L = 10mm

Ic
(mA)
20
15
10
5
22
0
500
1000
1500
2000
E
(10² Lux)

δ = Ic / I max
1
0,5
0,25
23
26
-90° -60° -30° 0 +30° +60° +90° θ

ILLUMINATION SENSOR WITH ATTENUATING DIFFUSER

BACKGROUND OF THE INVENTION

The present invention relates to an illumination sensor adapted for delivering electric information proportional to an illumination within a wide illumination range, for example of the order of 0 to 200,000 lux.

Generally, the devices for measuring illumination usually include sensors consisting or using opto-electronic components such for example as photodiodes or phototransistors.

Now it so happens that, in the technology used at present for constructing them, these components have a number of drawbacks.

a first of these drawbacks is the non linearity of the signal delivered by the sensor as a function of the illumination, which non linearity requires the use downstream of the sensor of a relatively complex and expensive electronic linearization circuit.

a second drawback comes from the fact that when the illumination increases, the photoelectronic component is very rapidly saturated, which limits the illumination range in which it may make the measurement.

a third drawback is that the aperture angle of the photoelectronic component is very small, which leads to using, in order to extend this angle, wide angle optical assemblies, even optical guide circuits.

The aim of the invention is then essentially the construction of a sensor of very simple and inexpensive design which overcomes these drawbacks.

SUMMARY OF THE INVENTION

According to the invention, this sensor includes particularly:

a sleeve made from a translucent material, this sleeve having a bottom intended to be exposed to the light whose intensity it is desired to measure, a photoelectronic component positioned inside the sleeve, with its sensitive face disposed in line with said bottom, and, means for joining said component and said sleeve together.

In such a sensor, the bottom plays the role of an optical interface for transforming the incident light, through the diffusing properties of the translucent material, into an infinity of light sources situated in the optical field of the optoelectronic component. Thus problems relative to the aperture angle of the optoelectronic component are overcome.

Thus, in the case of a bottom having an external flat face, it becomes possible to measure illuminations produced by light rays having angles of incidence close to 90.

This result may be considerably improved by using a bottom whose external surface has a convex shape, for example a conical shape or a spherical shape.

Furthermore, using a bottom in the form of a meniscus, with a convex external face and a concave internal face, a concentration of the diffused light is obtained on the sensitive face of the photoelectronic component.

Furthermore, it is possible to improve the performances of the sensor by trapping the light radiation diffused by the bottom. For this, it is possible to coat the inner wall of the sleeve, at least in a zone between the bottom and the photoelectronic component, with an optically reflecting element.

It should be noted that the thickness of material at the level of the bottom determines the attenuation of the incident radiation with respect to the diffused radiation. Now this attenuation must be provided so as to avoid saturation of the photoelectronic component and so as to ensure that this latter operates in a range where its response varies linearly as a function of the illumination.

This is why the invention also provides a sleeve in which the bottom has at the outset a relatively great thickness, this thickness then being adjusted and made conformable by the user to the desired type of application by machining.

According to another characteristic of the invention, the means for fixing the component in the sleeve consists of a covering made from a transparent material such for example as an elastomer filling at least partially the free volume between the component and its connection elements and the sleeve.

This covering then provides, in addition to its holding function, optical continuity between the bottom of the sleeve and the window of the photoelectronic element usually situated in line with its sensitive zone.

Advantageously, the index of refraction of this covering will be chosen substantially equal to that of the transparent material forming the window.

BRIEF DESCRIPTION OF THE DRAWINGS

Embodiments of the invention will be described hereafter by way of non limitative examples, with reference to the accompanying drawings in which.

BRIEF DESCRIPTION OF THE PREFERRED EMBODIMENTS

Figure 1:
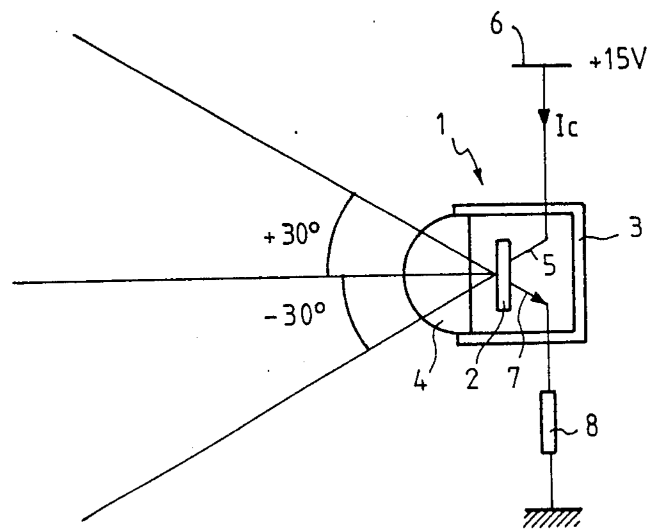
FIG. 1 shows schematically a conventional phototransistor assembly.

Such as shown in FIG. 1, the phototransistor 1 is formed of a semiconductor element 2 housed in a case 3 having a window 4 situated in line with the face of this semiconductor element sensitive to the light rays. This window 4 is usually made from a glass insert having a convex external face.

The semiconductor element further has a collector electrode 5 which, in the example shown, is connected to a positive voltage source 6, for example of 15 V and an emitter electrode 7 connected to ground through a resistor 8, for example of 710 Ω.

Figure 2:
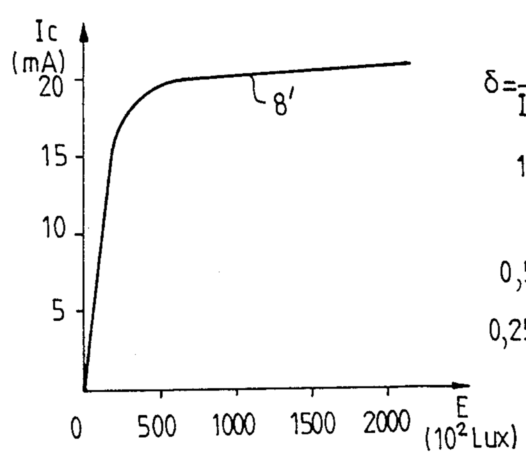
FIGS. 2 and 3 are two graphic representations showing respectively the response curve of the phototransistor as a function of the illumination and the curve variation of the attenuation as a function of the angle of incidence of the light rays.

FIG. 2 shows the curve of variation 8' of the current Ic flowing through the phototransistor for an illumination varying between 0 and 200,000 lux. It can be seen in this figure that starting from zero illumination, the current Ic increases rapidly and linearly until the illumination reaches a value of the order of 25,000 lux for a current of about 15 mA. From this value, curve 8' bends, then the current is stabilized from an illumination of 210,000 lux at a constant value, of the order of 20 mA. This stabilization is due to the phenomenon of saturation of the phototransistor 1. It is clear that, because of this saturation, the phototransistor 1 can only be used directly for limited illumination ranges, in this case from 0 to 25,000 lux.

Figure 3:
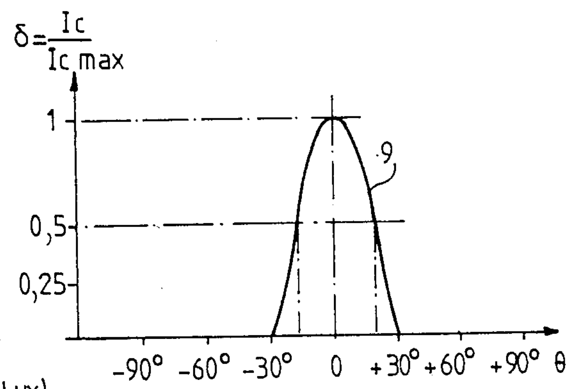

The curve 9 of FIG. 3 further shows that the aperture angle δ of the sensor is very small (±18°) with respect to the normal for an attenuation $\delta = Ic/Imax$ of the current Ic of 50%.

Figure 4:
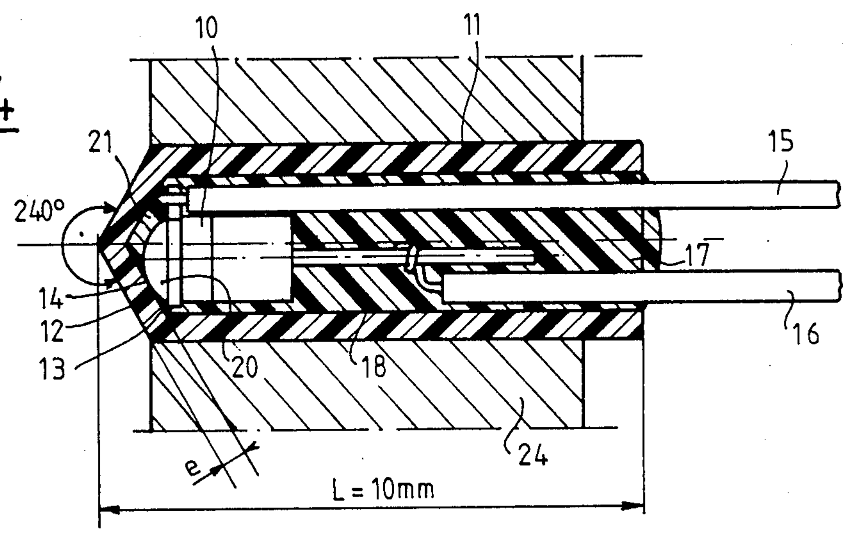
FIG. 4 is a schematical axial section of a sensor in accordance with the invention.

The sensor shown in FIG. 4 overcomes all these three drawbacks.

It comprises a phototransistor 10 of the type shown in FIG. 1, mounted in a sleeve of cylindrical section whose bottom 12 of thickness 3 has a convex surface 13 of conical shape and an inner concave face 14 also conical. Of course, the dimensions of this sleeve 11 depend on those of the phototransistor used. Thus, in the case of a currently used phototransistor, for example of type BPX 31, commercialized by the firm RTC, the outer diameter of the sleeve may be of the order of 3.4 mm, whereas its length L may be less than 10 mm. As previously mentioned, this sleeve 11 must be made from a translucent material with good diffusibility of the light rays. Its rigidity must be sufficient to provide good mechanical protection of the sensor. Furthermore, its hardness and its inertia with respect to corrosion must be sufficient to withstand, without modification of its optical properties, the agents used for cleaning the external face of the bottom which forms in fact the light receiving zone and must remain perfectly clean lke all optical components.

Excellent results have been obtained with a white translucent plastic material commercialized by the firm DU PONT under the name of "Delrin".

In this sensor, the electric connection between the phototransistor 10 and the electronic measurement circuit is provided by conducting wires 15, 16, connected respectively to the emitter and to the collector of the phototransistor 10, these wires, 15, 16 extending axially through the sleeve 11 then leaving through its opening 17, opposite the bottom.

Positioning of the phototransistor 10 as well as portions of the conducting wires 15, 16 situated inside the sleeve is provided by covering them with a transparent plastic material 18, for example an elastomer, whose index of refraction is close to that of the glass insert 20 forming the window of the phototransistor 10.

The purpose of such covering is not limited to the single mechanical function.

In fact, it also provides perfect sealing of the sensor. Furthermore, the part of this covering which fills volume 21 between the sensitive face of phototransistor 10 and bottom 12 provides optical continuity of the optic radiation diffused by bottom 12. It avoids in particular the discontinuity by which these radiations would be affected at the level of the surface of the insert 20 of the phototransistor 10 if the volume had a different index of refraction (which would for example be the case if this volume were empty).

In the case shown in FIG. 4, the conicity of the external face 13 of bottom 12 has been provided substantially equal to 240° so as to extend as much as possible the aperture angle of the sensor.

Figure 5:
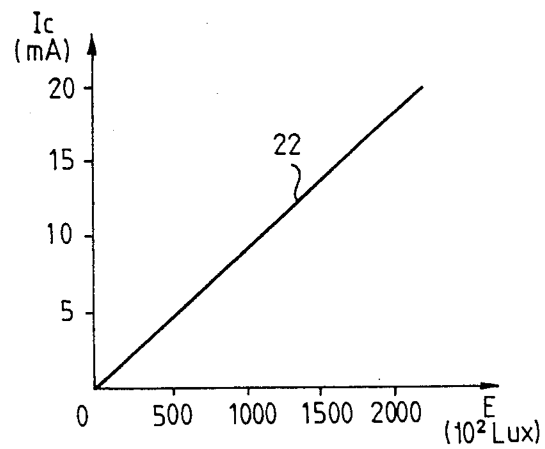
FIGS. 5 and 6 are graphic representations similar to those of FIGS. 2 and 3 which illustrate the performances of a sensor as shown in FIG. 4.
Figure 6:
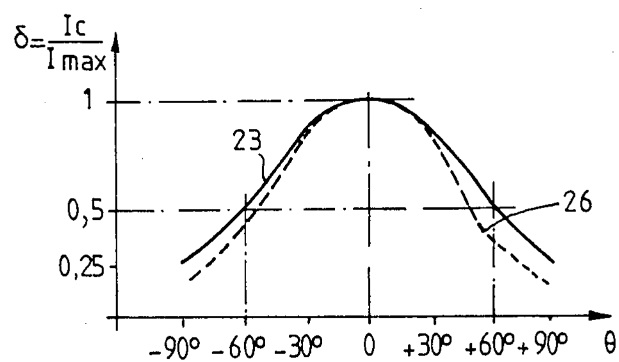

The performances of the above described sensor are illustrated in FIGS. 5 and 6.

Thus, the graph of FIG. 5 shows that the current Ic (curve 22) follows a linear law as a function of the illumination E, even for values greater than 200,000 lux.

Furthermore, as can be seen in FIG. 6, the aperture angle is increased to ±60° for an attenuation of 50% of the current Ic, whereas an angle of ±90° remains usable, the attenuation (curve 23) in this case being of the order of 75%.

It should be noted that, because of the cylindrical shape of sleeve 11, mounting of the sensor is considerably simplified. It may for example be simply engaged, as shown in a bore of corresponding diameter of the support structure 24.

Of course, the invention is not limited to the above described form of the sleeve.

Figure 7:
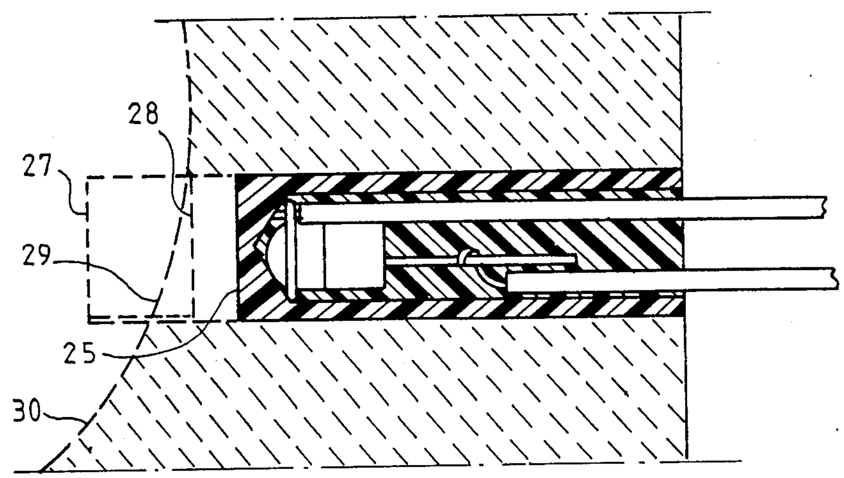
FIGS. 7 and 8 show schematically, in axial section, variants of construction of the sensor of the invention.

Thus, the outer face of the sleeve could be flat, as shown in FIG. 7 with a continuous line (reference 25). It so happens in fact that this solution, with slightly lower performances, in the case of high angles of incidence remains however interesting, as is clear from curve 26 shown with a broken line in FIG. 6.

Furthermore, the sleeve may have at the outset a relatively thick bottom (of the order of several times the thickness of the sleeve) which the user may himself conform to the type of application envisaged. FIG. 7 shows such a bottom with broken lines (reference 27).

In particular, the operator may himself adjust the thickness of the bottom, so as to obtain the desired attenuation, for example by bringing it to the thickness indicated by the broken line 28.

He may of course rectify the bottom so as to obtain a continuity of form with the front face of the support and thus avoid the sensor projecting or being set back with respect thereto.

Thus, in FIG. 7, the curved broken line 29 illustrates a conformation of the bottom appropriate to the curvature of the front face 30 of the support (also shown with broken lines).

Figure 8:
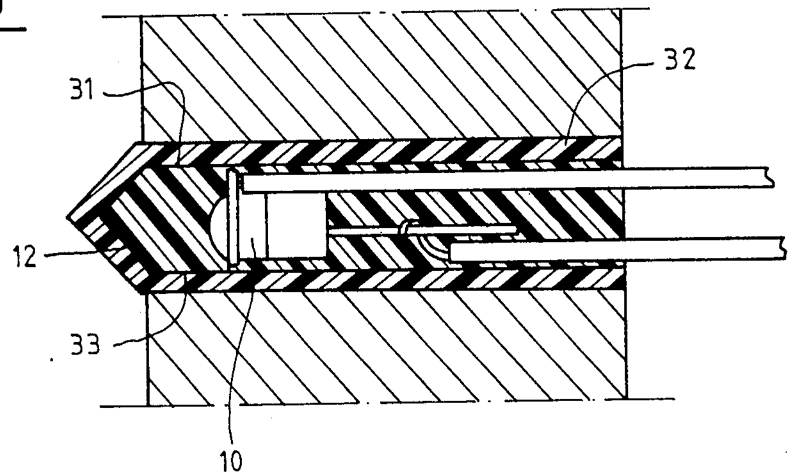

In the example shown in FIG. 8, the inner cylindrical surface portion 31 of the sleeve 32 situated between the phototransistor 10 and bottom 12 is covered with a reflecting coating 33 for reflecting a fraction of the light radiation diffused by the bottom 12 onto the sensitive surface of the phototransistor 10.

Thus, it proves then that the sensor of the invention is particularly advantageous more especially because of:

its possibility of use under the most severe environmental conditions;

its compactness and its conformation, its simplicity of construction and use, ready adaptation of the sensitivity of the sensor to the desired illumination dynamics, the possibility of modifying the shape of the end of the sensor with however a slight reduction of the aperture angle which however remains within acceptable limits for the application.

The sensor may consequently be used not only in high technology fields but also in public sectors.

What is claimed is:

1. An illumination sensor adapted for delivering electric information proportional to an illumination provided by an incident light, over a wide illumination range, said sensor including:

i. a sleeve made from a translucent material having diffusing properties, this sleeve having a tubular wall and a bottom wall having an internal surface and an external surface which is intended to be exposed to the incident light, said bottom wall serving to transform this incident light into a diffused light which is emitted inside the sleeve, with an attenuation depending on the thickness of the bottom wall;

ii. an optoelectronic component positioned inside the sleeve and having a sensitive face located in front of said internal surface so as to detect the diffused light and to deliver said electric information;

iii. means for joining said component and said sleeve together, the thickness of the bottom wall having a value corresponding to a required attenuation.

2. The sensor as claimed in claim 1, wherein said external surface is a plane surface.

3. The sensor as claimed in claim 1, wherein said external surface is a convex surface.

4. The sensor as claimed in claim 1, wherein said internal surface is a concave surface.

5. The sensor as claimed in claim 1, wherein said bottom has a great thickness of the order of several times the thickness of the sleeve, and is shaped by a user by cutting so as to adjust the thickness of the bottom wall as a function of the required attenuation.

6. The sensor as claimed in claim 1, wherein means for trapping the light diffused by the bottom wall are provided inside the sleeve between said bottom wall and said optoelectronic component.

7. The sensor as claimed in claim 6 wherein said trapping means consist of at least one optically reflecting element disposed in a zone of the sleeve situated between the optoelectronic component and said bottom wall.

8. The sensor as claimed in claim 1, wherein said means for joining the optoelectronic component and the sleeve consist of a covering made from a transparent plastic material.

9. The sensor as claimed in claim 8, wherein the sensitive face of the optoelectronic component has a transparent window and said plastic material has an index of refraction substantially equal to that of the said transparent window.

10. The sensor as claimed in claim 8, wherein said plastic material is an elastomer.

11. The sensor as claimed in claim 1, wherein the material forming the sleeve is a translucent plastic material.

12. The sensor as claimed in claim 11, wherein said plastic material is white "Delrin".

13. The sensor as claimed in claim 1, wherein said optoelectronic component is a phototransistor.

* * * * *